US009899520B2

(12) United States Patent
Ye et al.

(10) Patent No.: US 9,899,520 B2
(45) Date of Patent: Feb. 20, 2018

(54) METHOD FOR FABRICATING SEMICONDUCTOR DEVICE

(71) Applicant: UNITED MICROELECTRONICS CORP., Hsinchu (TW)

(72) Inventors: Yi-Liang Ye, Kaohsiung (TW); Kuang-Hsiu Chen, Tainan (TW); Chueh-Yang Liu, Tainan (TW); Yu-Ren Wang, Tainan (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 82 days.

(21) Appl. No.: 14/978,409

(22) Filed: Dec. 22, 2015

(65) Prior Publication Data

US 2017/0179286 A1 Jun. 22, 2017

(51) Int. Cl.
*H01L 29/78* (2006.01)
*H01L 29/66* (2006.01)
*H01L 21/02* (2006.01)
*H01L 21/033* (2006.01)

(52) U.S. Cl.
CPC ...... *H01L 29/7848* (2013.01); *H01L 21/0245* (2013.01); *H01L 21/02636* (2013.01); *H01L 21/0332* (2013.01); *H01L 29/66636* (2013.01)

(58) Field of Classification Search
CPC ............. H01L 29/66636; H01L 21/0245
See application file for complete search history.

(56) References Cited

U.S. PATENT DOCUMENTS

| | | | |
|---|---|---|---|
| 2011/0049585 A1 | 3/2011 | Beyer et al. | |
| 2011/0189615 A1* | 8/2011 | Hou ............ | G03F 7/20 430/313 |
| 2016/0149017 A1* | 5/2016 | Tsai ............ | H01L 29/66636 257/288 |
| 2016/0351568 A1* | 12/2016 | Chang .......... | H01L 29/785 |

* cited by examiner

*Primary Examiner* — Jay C Chang
*Assistant Examiner* — Mikka Liu
(74) *Attorney, Agent, or Firm* — WPAT, PC

(57) ABSTRACT

A method for forming a semiconductor device includes steps as follows: Firstly, a semiconductor substrate having a circuit element with at least one spacer formed thereon is provided. Next, an acid treatment is performed on a surface of the spacer. A disposable layer is then formed on the circuit element and the spacer. Thereafter, an etching process is performed to form at least one recess in the semiconductor substrate adjacent to the circuit element. Subsequently, a selective epitaxial growth (SEG) process is performed to form an epitaxial layer in the recess.

15 Claims, 3 Drawing Sheets

METHOD FOR FABRICATING SEMICONDUCTOR DEVICE

BACKGROUND

Technical Field

The disclosure relates in generally to a method for fabricating a semiconductor device, and more particularly to a method for fabricating a semiconductor device with a strained-silicon structure.

Description of the Related Art

With the progress of device miniaturization, enhancing carrier mobility and driving current of the metal-oxide-semiconductor (MOS) transistor has become an important issue. In order to improve the speed of the MOS transistor, a strained-silicon technique has been developed and is taken as a main solution to improve the performance of the MOS transistor.

One approach of the strained-silicon technique includes steps of applying a patterned silicon nitride (SiN) hard mask layer and a spacer formed on a gate of the MOS transistor serving as an etching mask to forming recesses in a silicon substrate on which the gate is formed, and applying a selective epitaxial growth (SEG) method to forming an epitaxial layer, such as a silicon-germanium (SiGe) layer, to fill the recesses.

Because the lattice constant of the epitaxial SiGe layer is larger than that of the silicon, such characteristic is employed to cause alteration to the band structure of the silicon in the channel region of the silicon substrate. Accordingly, the carrier mobility and the speed performance of the MOS transistor are improved.

However, the SiN hard mask layer typically has a Si-rich surface (due to the compositional properties of SiN layers) that may serves as a seed layer in the SEG process, numberless fall-on defects including SiGe with an average diameter ranging from 30 to 60 nanometers (nm) are ubiquitously formed on the SiN hard mask layer, so as to make the SiN hard mask layer having a haze surface.

With the progress of device miniaturization and the shrink of critical dimension (CD), the SiN hard mask layer may be thinned down. The fall-on defects may extend more likely passing through the SiN hard mask layer and landing on the spacer or the gate of the MOS transistor to cause a plurality of granular structures hardly to be removed by the subsequent SiN hard mask removing process. As a result the subsequent process performed on the gate for forming the MOS transistor may be restricted and the reliability of the MOS transistor may be adversely affected.

Therefore, there is a need of providing an improved method for fabricating the semiconductor device to obviate the drawbacks encountered from the prior art.

SUMMARY

One aspect of the present disclosure is to provide a method for fabricating a semiconductor device, wherein the method includes steps as follows: Firstly, a semiconductor substrate having a circuit element with at least one spacer formed thereon is provided. Next, an acid treatment is performed on a surface of the spacer. A disposable layer is then formed on the circuit element and the spacer. Thereafter, an etching process is performed to form at least one recess in the semiconductor substrate adjacent to the circuit element. Subsequently, a selective epitaxial growth (SEG) process is performed to form an epitaxial layer in the recess.

In accordance with the another aspect of the present disclosure, a method for fabricating a metal-oxide-semiconductor (MOS) transistor is provided, wherein the method includes steps as follows: Firstly, a semiconductor substrate having an gate structure with at least one spacer formed thereon is provided. Next, an acid treatment is performed on a surface of the spacer. A disposable layer is then formed on the gate structure and the spacer. Thereafter, an etching process is performed to form at least one recess in the semiconductor substrate adjacent to the gate structure. Subsequently, a selective epitaxial growth (SEG) process is performed to form an epitaxial layer in the recess.

In accordance with the aforementioned embodiments of the present disclosure, a method for fabricating a semiconductor device is disclosed. A semiconductor substrate having a circuit element is firstly provided. An acid treatment is performed to form a silicon-oxide layer on a spacer disposed on sidewalls of the circuit element, prior to the forming of a patterned SiN hard mask layer serving as an etching mask for form recesses in the substrate. A SEG process is subsequently performed to form an epitaxial layer in the recess.

By using the silicon-oxide layer formed by the acid treatment serving as a seeding layer to allow the SiN hard mask layer having a more compact structure formed thereon, the granular size of the fall-on defects formed on the SiN hard mask layer during the SEG process can be minimized, so as to prevent the fall-on defects from passing through the SiN hard mask layer and landing on the spacer or the circuit element. Such that, the reflection haze on the SiN hard mask layer can be thus improved, and the fall-on defects can be removed by the subsequent SiN hard mask removing process more easily. As a result, the subsequent processes performed on the circuit element for forming the semiconductor device may not be restricted by the fall-on defects, and the reliability of the resulted semiconductor device can be improved.

BRIEF DESCRIPTION OF THE DRAWINGS

The above objects and advantages of the present disclosure will become more readily apparent to those ordinarily skilled in the art after reviewing the following detailed description and accompanying drawings, in which.

DETAILED DESCRIPTION

Figure 1A:
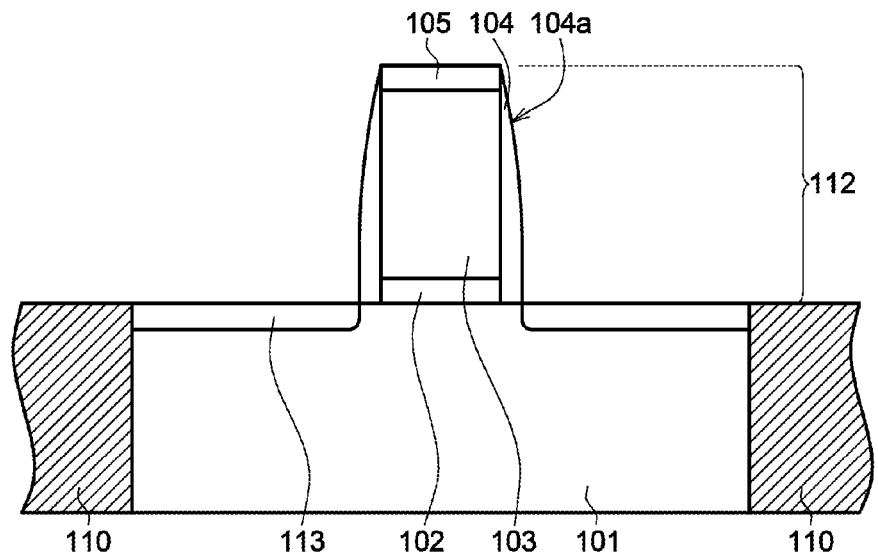
FIGS. 1A to 1F are cross-sectional views illustrating the processing structures for fabricating a semiconductor device in accordance with one embodiment of the present disclosure.

The embodiments as illustrated below provide a method for fabricating a semiconductor device to improve the reliability of the semiconductor device. The present disclosure will now be described more specifically with reference to the following embodiments illustrating the structure and arrangements thereof.

It is to be noted that the following descriptions of preferred embodiments of this disclosure are presented herein for purpose of illustration and description only. It is not intended to be exhaustive or to be limited to the precise form disclosed. Also, it is also important to point out that there may be other features, elements, steps and parameters for implementing the embodiments of the present disclosure which are not specifically illustrated. Thus, the specification and the drawings are to be regard as an illustrative sense rather than a restrictive sense. Various modifications and similar arrangements may be provided by the persons skilled in the art within the spirit and scope of the present invention. In addition, the illustrations may not be necessarily be drawn to scale, and the identical elements of the embodiments are designated with the same reference numerals.

FIGS. 1A to 1F are cross-sectional views illustrating the processing structures for fabricating a semiconductor device 100 in accordance with one embodiment of the present disclosure. In the present embodiment, the semiconductor device 100 is a MOS transistor. The method for fabricating the semiconductor device 100 includes steps as follows:

Firstly, a semiconductor substrate 101 having a circuit element 112 with at least one spacer 104 formed thereon is provided. In some embodiments of the present disclosure, the semiconductor substrate 101 may be a silicon substrate, such as a silicon wafer. In some other embodiments, the semiconductor substrate 101 can further include other layer, such as semiconductor layers consisting of semiconductor material other than silicon or insulating layers (e.g. a silicon-oxide layer). For example, in a preferred embodiment, the semiconductor substrate 101 can be a silicon-on-insulator (SOI) substrate. In the present embodiment, the semiconductor substrate 101 is a bulk semiconductor substrate made of single-crystal silicon.

A plurality of shallow trench isolations (STIs) 110 are formed in the semiconductor substrate 101 to define at least one active region on which the circuit element 112 is formed. In some embodiments of the present disclosure, the circuit element 112 can be a gate structure of a MOS transistor including a gate dielectric layer 102 and a gate electrode 103.

The forming of the gate structure (circuit element 112) includes steps as follows: Firstly, a dielectric layer and a poly-silicon layer are formed in sequence on the semiconductor substrate 101. A lithography etching process is then performed to remove portions of the gate dielectric layer and the poly-silicon layer to form the gate dielectric layer 102 and the gate electrode 103 stacked on the semiconductor substrate 101.

In the present embodiment, the gate dielectric layer 102 may include silicon-oxide, silicon nitride or high-k materials (such as hafnium dioxide ($HfO_2$), zirconium dioxide ($ZrO_2$) and titanium dioxide ($TiO_2$)). The gate electrode 103 may include poly-silicon or metal. In a preferred embodiment, the gate structure (circuit element 112) further includes a capping layer 105, such as a silicon nitride layer, formed at the top of the gate electrode 102b.

Then, an ion implantation is performed to form lightly doped drains (LDDs) 113 in the semiconductor substrate 101 respectively at two sides of the gate structure, and followed by forming a spacer 104 on the sidewalls of the gate structure. The spacer 104 can be made of SiN, silicon carbonitride (SiCN), silicon-oxide or the arbitrary combinations thereof. In some embodiments of the present disclosure, the spacer 104 may be a multilayer structure. However, in the present embodiment, the spacer 104 is depicted (in FIG. 1A) as a single-layer liner made of SiCN.

Figure 1B:
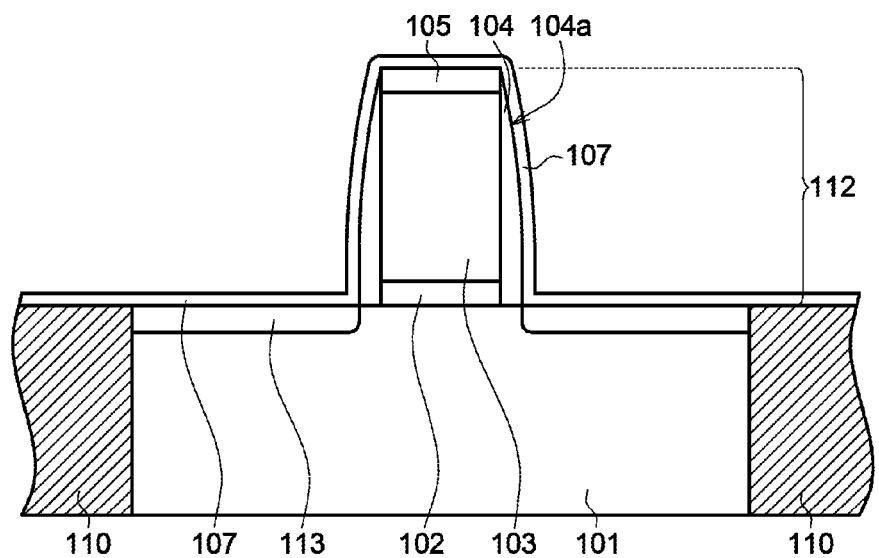

Next, an acid treatment 106 is performed on the spacer 104, so as to form a silicon-oxide layer 107 on the surface 104a of the spacer 104 (see FIG. 1B). In some embodiments of the present disclosure, the acid treatment 106 includes steps of using a sulfuric acid/hydrogen peroxide/deionized water mixture (SPM) as a wetting agent directly in contact with the top surface of the semiconductor substrate 101 and the surface 104a of the spacer 104.

The ratio of sulfuric acid to hydrogen peroxide (sulfuric acid/hydrogen peroxide) substantially ranging from 1 to 5, preferably is about 4 (4:1) and more preferably is about 2 (2:1). The reaction temperature is about 120° C. The silicon-oxide layer 107 has a thickness substantially ranging from 1 angstrom (Å) to 5 Å.

Figure 1C:
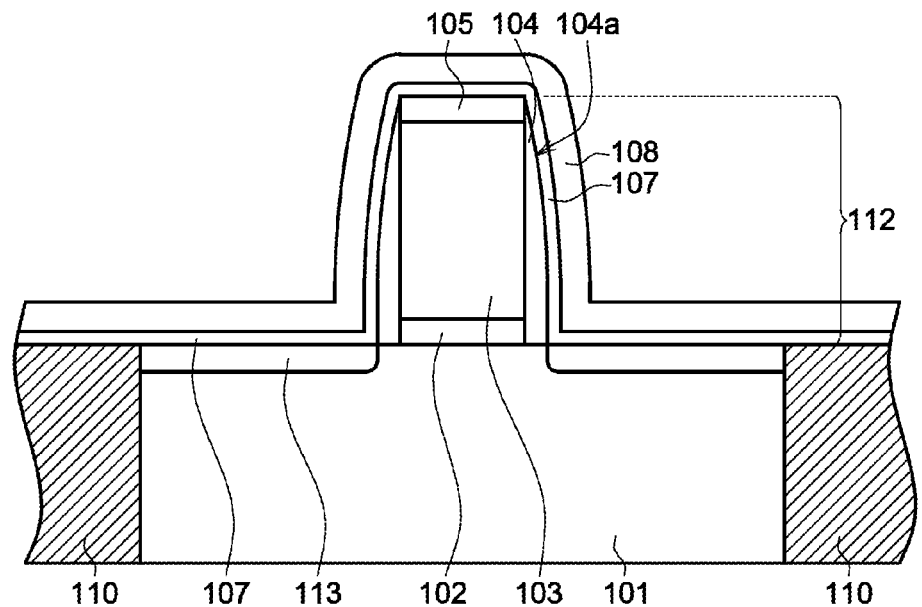

A disposable layer 108 is then formed on the gate structure (circuit element 112) and the spacer 104 (see FIG. 1C). In some embodiments of the present disclosure, the disposable layer 108 is a hard mask layer formed on the gate structure by chemical vapor deposition (CVD), low pressure chemical vapor deposition (LPCVD), plasma-enhanced chemical vapor deposition (PECVD), sub-atmosphere chemical vapor deposition (SACVD), atomic layer deposition (ALD), physical vapor deposition (PVD), and/or other appropriate processing techniques.

The hard mask layer may include SiN, silicon oxynitride (SiON), SiCN, silicon carbide (SiC), and/or other materials. Preferably, the hard mask layer is a SiN layer that has an etching rate different from SiO, by which the STI 110 is filled. Thus, the STI 110 is prevented from damage during the following etching process 115 (that will be further described below).

In addition, since the silicon-oxide layer 107 can serve as a seeding layer to allow the SiN hard mask layer (disposable layer 108) formed thereon, thus the Si—N bonds formed on the SiN/silicon-oxide interface between the SiN hard mask layer and the silicon-oxide layer 10 may be decreased while Si—O bonds are increased. As a result, the SiN hard mask layer (disposable layer 108) formed on the silicon-oxide layer 107 can have a more compact structure than the conventional SiN hard mask layer that is directly formed on the SiCN spacer 104.

Figure 1D:
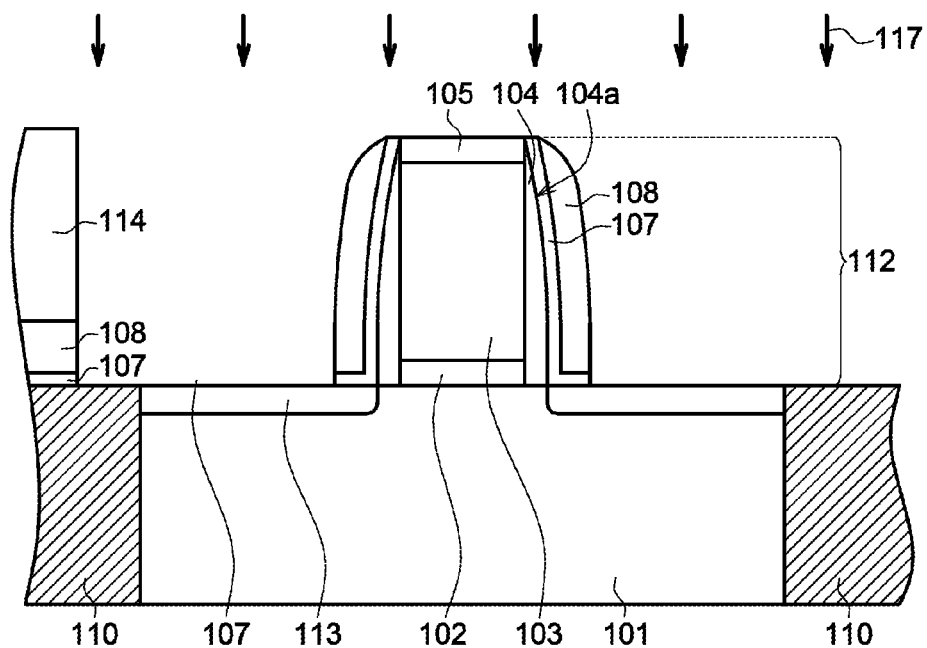
Figure 1E:
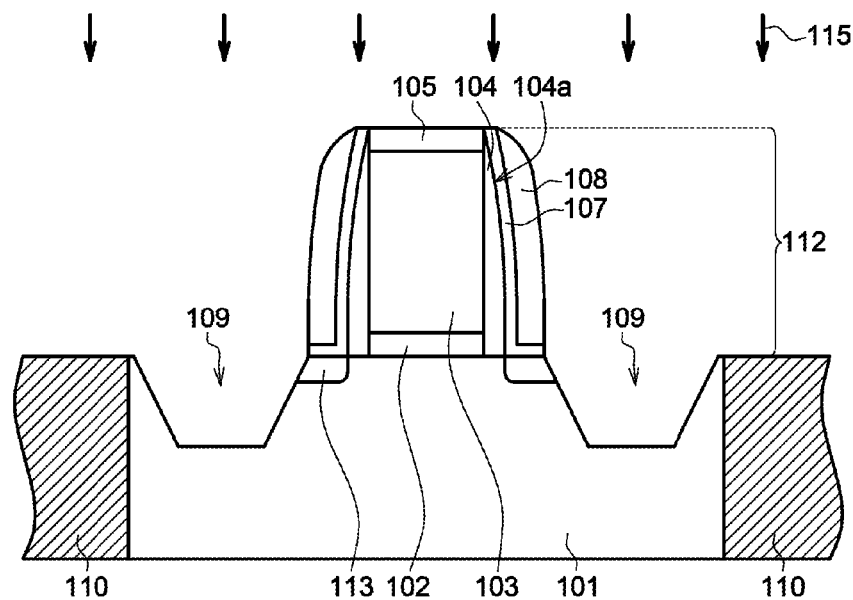
Figure 1F:
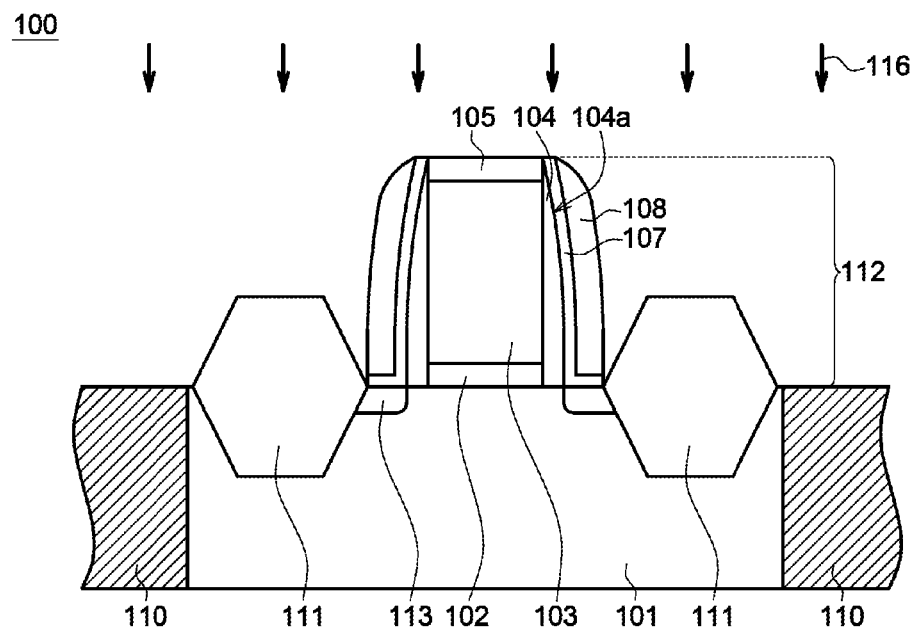

Thereafter, an etching process 115 is performed to form at least one recess 109 in the semiconductor substrate 101 adjacent to the gate structure (circuit element 112). In the present embodiment, the etching process 115 includes steps as follows: A photoresist layer 114 is formed on the surface of the hard mask layer (disposable layer 108). Then, a photolithography etching process 117 is performed to pattern the photoresist layer 114 and the hard mask layer (disposable layer 108). As shown in FIG. 1D, the patterned photoresist layer 114 does not cover the gate structure, meanwhile the semiconductor substrate 101, the spacer 104, the silicon-oxide layer 107 and the hard mask layer (disposable layer 108) are exposed.

After removing the patterned photoresist layer 114, the patterned hard mask layer (disposable layer 108), the silicon-oxide layer 107 and the spacer 104 are used as an etching mask. And the etching process 115 is performed to form the recesses 109 in the semiconductor substrate 101 at two sides of the gate structure (see FIG. 1E).

In some embodiments of the present disclosure, after the etching process 115 is carried out, there are still a portion of hard mask layer (disposable layer 108) is remained on the sidewalls of the gate structure. In the present embodiment, the portion of the hard mask layer remaining on the surface 104a of the spacer 104 has a thickness less than about 30 Å, preferably ranging from 10 Å to 30 Å.

After forming the recesses 109, a cleaning process (not shown) used to remove native oxides and other impurities is performed. A SEG process 116 is subsequently performed to form an epitaxial layer 111 respectively filled in the recess 109 (see FIG. 1F). In some embodiments of the present disclosure, the MOS transistor (the semiconductor device 100) can be a PMOS transistor, and the epitaxial layer 111 may include SiGe. In some other embodiments, the MOS transistor can be an NMOS transistor, the epitaxial layer 111 may alternatively include SiC or silicon phosphorus (SiP).

Additionally, another ion implantation (not show) is performed after performing the SEG process 116, to make the recesses 260 filled with the epitaxial layer 111 serving as the source/drain of the MOS transistor. However, the step sequence of the ion implantation is not limited, those skilled in the art would easily realize that the ion implantation can be performed before the etching process 115.

As discussed above, since the SiN hard mask layer (disposable layer 108) formed on the silicon-oxide layer 107 have a more compact structure, thus the fall-on defects 117 formed on the remaining portion of the SiN hard mask layer during the SEG process 116 may have smaller granule size and hardly passing through the SiN hard mask layer. Such that, the reflection haze of the SiN hard mask layer can be decreased, and the fall-on defects 117 can be removed by the subsequent hard mask layer removing process more easily. In the present embodiment, the remaining portion of the hard mask layer has a haze about 0.05 ppm after the SEG process 116 is performed.

In accordance with the aforementioned embodiments of the present disclosure, a method for fabricating a semiconductor device is disclosed. A semiconductor substrate having a circuit element is firstly provided. An acid treatment is performed to form a silicon-oxide layer on a spacer disposed on sidewalls of the circuit element, prior to the forming of a patterned SiN hard mask layer serving as an etching mask for form recesses in the substrate. A SEG process is subsequently performed to form an epitaxial layer in the recess.

By using the silicon-oxide layer formed by the acid treatment serving as a seeding layer to allow the SiN hard mask layer having a more compact structure formed thereon, the granular size of the fall-on defects formed on the SiN hard mask layer during the SEG process can be minimized, so as to prevent the fall-on defects from passing through the SiN hard mask layer and landing on the spacer or the circuit element. Such that, the reflection haze on the SiN hard mask layer can be thus improved, and the fall-on defects can be removed by the subsequent SiN hard mask removing process more easily. As a result, the subsequent processes performed on the circuit element for forming the semiconductor device may not be restricted by the fall-on defects, and the reliability of the resulted semiconductor device can be improved.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for forming a semiconductor device, comprising:
   providing a semiconductor substrate having a circuit element with at least one spacer formed on at least one sidewall of the circuit element, wherein the spacer comprises silicon carbonitride (SiCN);
   performing an acid treatment on a surface of the spacer, wherein the acid treatment comprises a sulfuric acid/hydrogen peroxide/deionized water mixture (SPM);
   forming a patterned disposable layer covering on the at least one sidewall of the circuit element and the spacer but not covering on a top surface of the circuit element, wherein the patterned disposable layer comprises silicon nitride (SiN);
   performing an etching process to form at least one recess in the semiconductor substrate adjacent to the circuit element; and
   performing a selective epitaxial growth (SEG) process to form an epitaxial layer in the recess.

2. The method according to claim 1, wherein the SPM has a ratio of sulfuric acid/hydrogen peroxide substantially ranging from 1 to 4.

3. The method according to claim 1, wherein a silicon-oxide layer is formed on the surface of the spacer by the acid treatment.

4. The method according to claim 3, wherein the silicon-oxide layer has a thickness substantially ranging from 1 angstrom (Å) to 5 Å.

5. The method according to claim 1, wherein the SEG process comprises a silicon-germanium (SiGe) epitaxial growth.

6. The method according to claim 1, wherein after the etching process is carried out, a portion of the patterned disposable layer having a thickness less than about 30 Å is remained on the surface of the spacer.

7. The method according to claim 6, wherein the remaining portion of the patterned disposable layer has a haze about 0.05 ppm after the SEG process is performed.

8. The method according to claim 1, wherein the circuit element comprises a gate structure.

9. A method for fabricating a metal-oxide-semiconductor (MOS) transistor, comprising:
   providing a semiconductor substrate having a gate structure with at least one spacer formed on at least one sidewall of the gate structure, wherein the spacer comprises SiCN;
   performing an acid treatment on a surface of the spacer, wherein the acid treatment comprises a SPM;
   forming a patterned disposable layer covering on the at least one sidewall of the gate structure and the spacer but not covering on a top surface of the gate structure, wherein the patterned disposable layer comprises SiN;
   performing an etching process to form at least one recess in the semiconductor substrate adjacent to the gate structure; and
   performing a SEG process to form an epitaxial layer in the recess.

10. The method according to claim 9, wherein the SPM has a ratio of sulfuric acid/hydrogen peroxide substantially ranging from 1 to 4.

11. The method according to claim 9, wherein a silicon-oxide layer is formed on the surface of the spacer by the acid treatment.

12. The method according to claim 11, wherein the silicon-oxide layer has a thickness substantially ranging from 1 Å to 5 Å.

13. The method according to claim 9, wherein the SEG process comprises a SiGe epitaxial growth.

14. The method according to claim 9, wherein after the etching process is carried out, a portion of the patterned disposable layer having a thickness less than about 30 Å is remained on the surface of the spacer.

15. The method according to claim 14, wherein the remaining portion of the patterned disposable layer has a haze about 0.05 ppm after the SEG process is performed.

* * * * *